United States Patent
Liu et al.

(10) Patent No.: US 7,006,020 B2
(45) Date of Patent: Feb. 28, 2006

(54) ENCODING AND DECODING METHOD OF A RECORD MEDIUM

(75) Inventors: Pi-Hai Liu, Hsinchu (TW); Yung-Chi Yang, Hsinchu (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 247 days.

(21) Appl. No.: 10/613,004

(22) Filed: Jul. 7, 2003

(65) Prior Publication Data

US 2004/0160345 A1    Aug. 19, 2004

(30) Foreign Application Priority Data

Feb. 11, 2003  (TW) ............................... 92102746 A

(51) Int. Cl.
*H03M 5/06*    (2006.01)
(52) U.S. Cl. ............................. 341/68; 341/50; 341/51
(58) Field of Classification Search ............. 341/50, 341/51, 67, 68
See application file for complete search history.

(56) References Cited

U.S. PATENT DOCUMENTS 5,798,719 A * 8/1998 Wise et al. .................... 341/67
5,821,886 A * 10/1998 Son .............................. 341/67

* cited by examiner

*Primary Examiner*—Jean Bruner Jeanglaude
(74) *Attorney, Agent, or Firm*—Birch, Stewart, Kolasch & Birch, LLP

(57) ABSTRACT

An encoding and decoding method of record medium having the concept of type and set is disclosed. The disclosed not only satisfy the DK-Constraint, the coding rate and DC-free control are better through the auxiliary conditions of type dependency and digital sum value. The available storage space of the record medium consequently increases. In the decoding procedures, the accuracy and efficiency are better through the auxiliary conditions of type dependency and forbidden type set. Thus, the decoding error consequently decreases.

40 Claims, 14 Drawing Sheets

ENCODING AND DECODING METHOD OF A RECORD MEDIUM

BACKGROUND OF THE INVENTION

1. Field of Invention

The invention is related to a method for generating and transforming encoding data, and more particularly to a method of generating encoding data and transforming decoding data applied run length limit (RLL) approach.

2. Related Art

The modulation and demodulation mechanism of a record medium, e.g., Compact Disk, or Digital Versatile Disk, is employed to encode original data to digital data via a specific encoding technology since the digital data occupy less storage space of record medium. The digital data are also transformed to the original data through a specific decoding technology. The modulation and demodulation of a record medium usually includes encoding and decoding. The most popular modulation/demodulation technologies of record media are Eight-to-Fourteen Modulations (EFM) applied for Compact Disks and EFMPlus applied for DVD. Both are Run Length Limit approaches of modulation technology.

The coding rate of the modulation and demodulation mechanism directly affects the available data storage space. Furthermore, for simplification of the encoding/decoding procedures and reduction of the original data range, there is a rule of (d, k) limitation that needs to be followed. Therefore, the reference tables for transformation between the original data and the digital data are developed to meet the (d, k) limitation through some auxiliary conditions. Take EFM for example. The EFM provides a coding rate of 8/17 under the (d, k) limitation of (2, 10). However, for linking two arbitrary digital date and meeting the (d, k) limitation, even improving the DC-free control ability, a merging code of three additional digits is added to the digital data of fourteen digits. So the coding efficiency becomes worse and the computing procedure becomes more complicated. EFMPlus provides a coding rate of 8/16 by linking Type and State approach under the (d, k) limitation of (2, 10). However, EFMPlus involves re-using much digital data, i.e., different digital data may be modulated as the same digital data. Therefore, auxiliary conditions are added in the modulation process.

SUMMARY OF THE INVENTION

The disclosed method improves the drawbacks of the modulation/demodulation mechanism of current record media. The main object of the invention is to enhance the coding rate, suit DC-free control and solve the decoding problem.

The main concept of the invention involves 'Type' and 'Set', and also satisfies (d, k) constraint. Thus, the method has complete auxiliary conditions to judge the modulation mechanism of record media. The modulation mechanism is irrelevant with 'stated. Not only the encoding procedures are simplified, the coding rate is also up to 8/15. Furthermore, the digital sum value (DSV) is employed to control DC-free sufficiently. Meanwhile, the accuracy and efficiency are highly improved through the auxiliary conditions of a type dependent and forbidden type set. Comparing the disclosed method with the EFM and EFMPlus method, the disclosed method has less complexity and higher efficiency.

Further scope of applicability, of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention will become more fully understood from the detailed description given hereinbelow illustration only, and thus are not limitative of the present invention, and wherein:

Figure 3A:
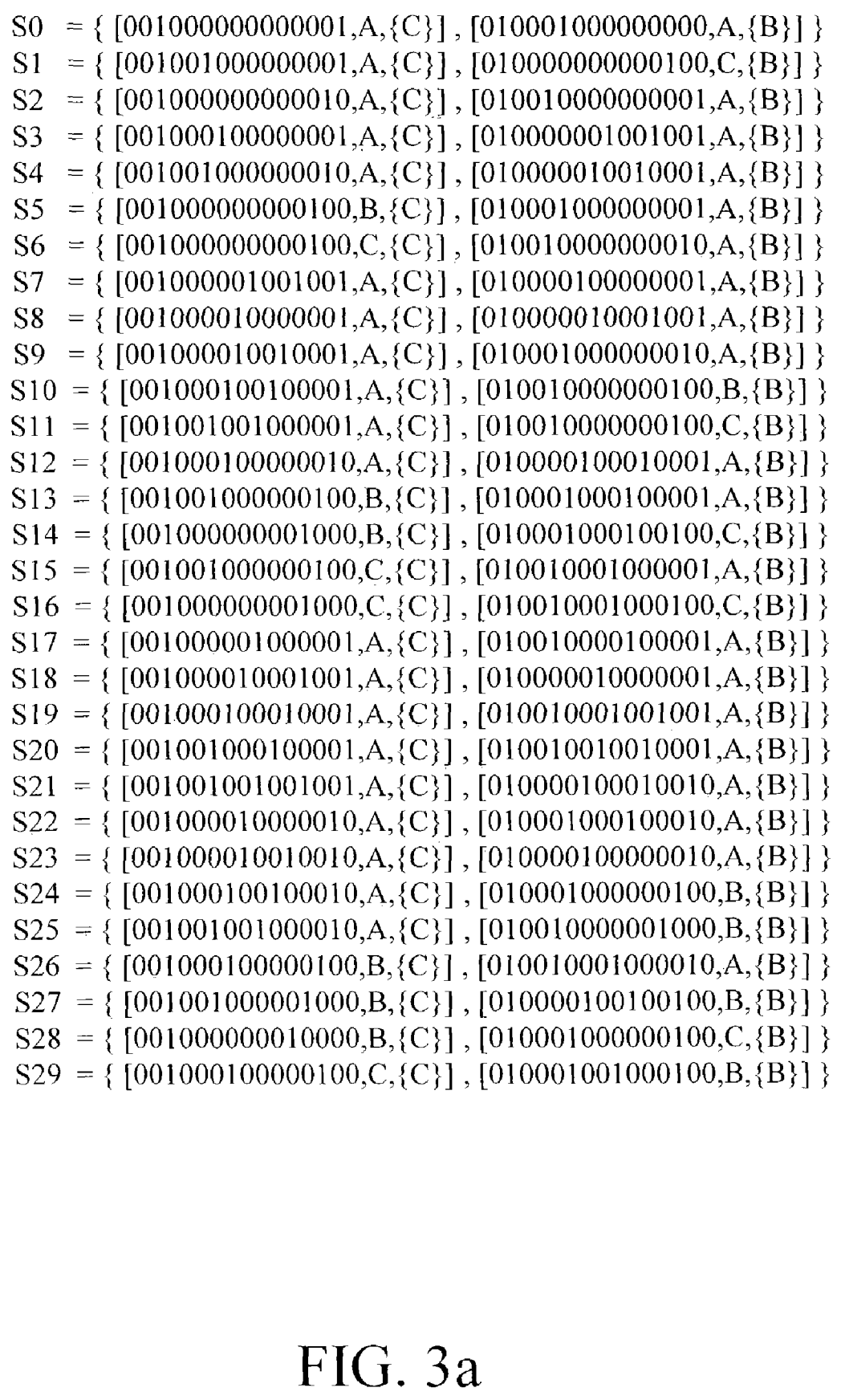
Figure 3B:
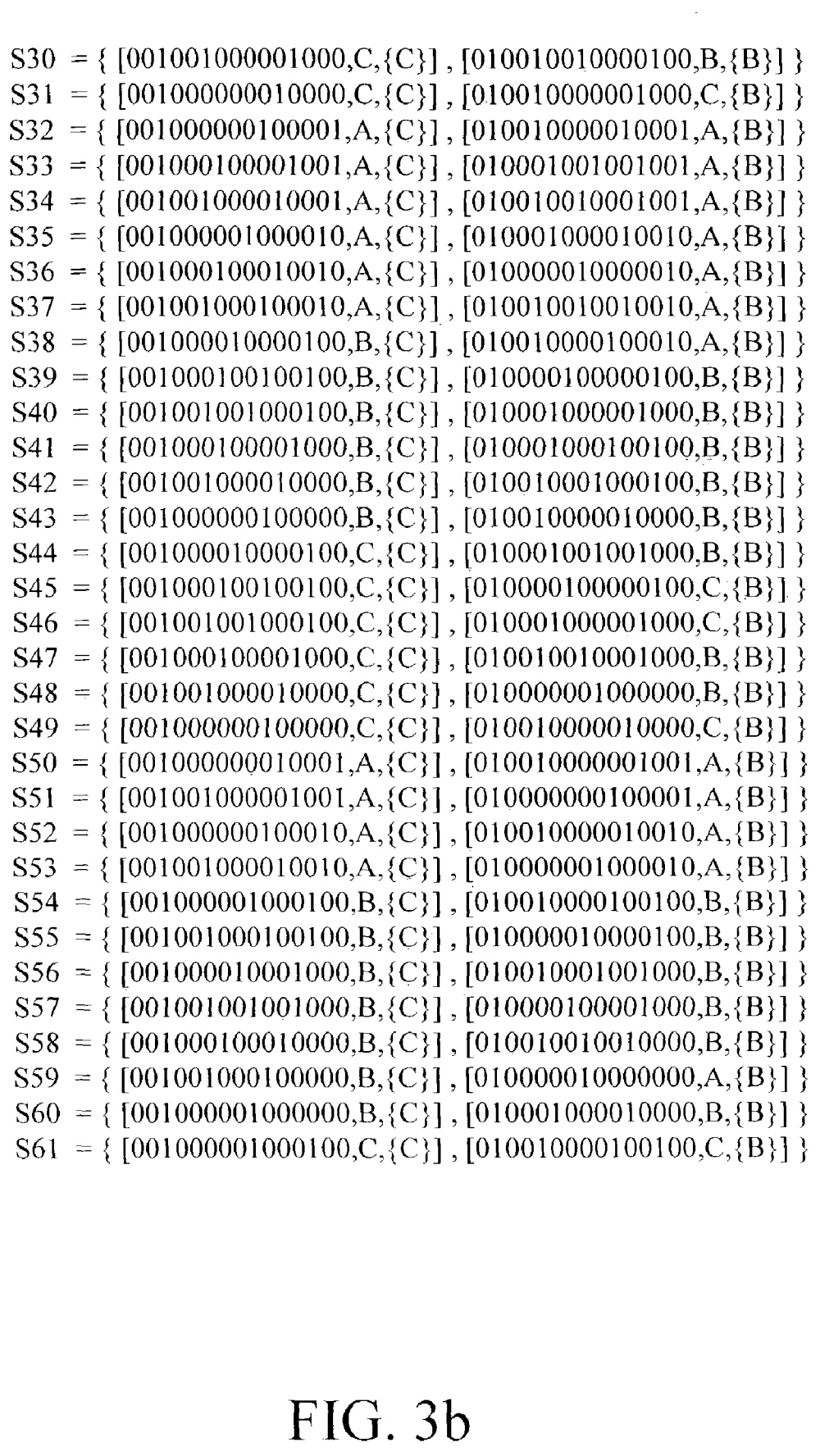
Figure 3C:
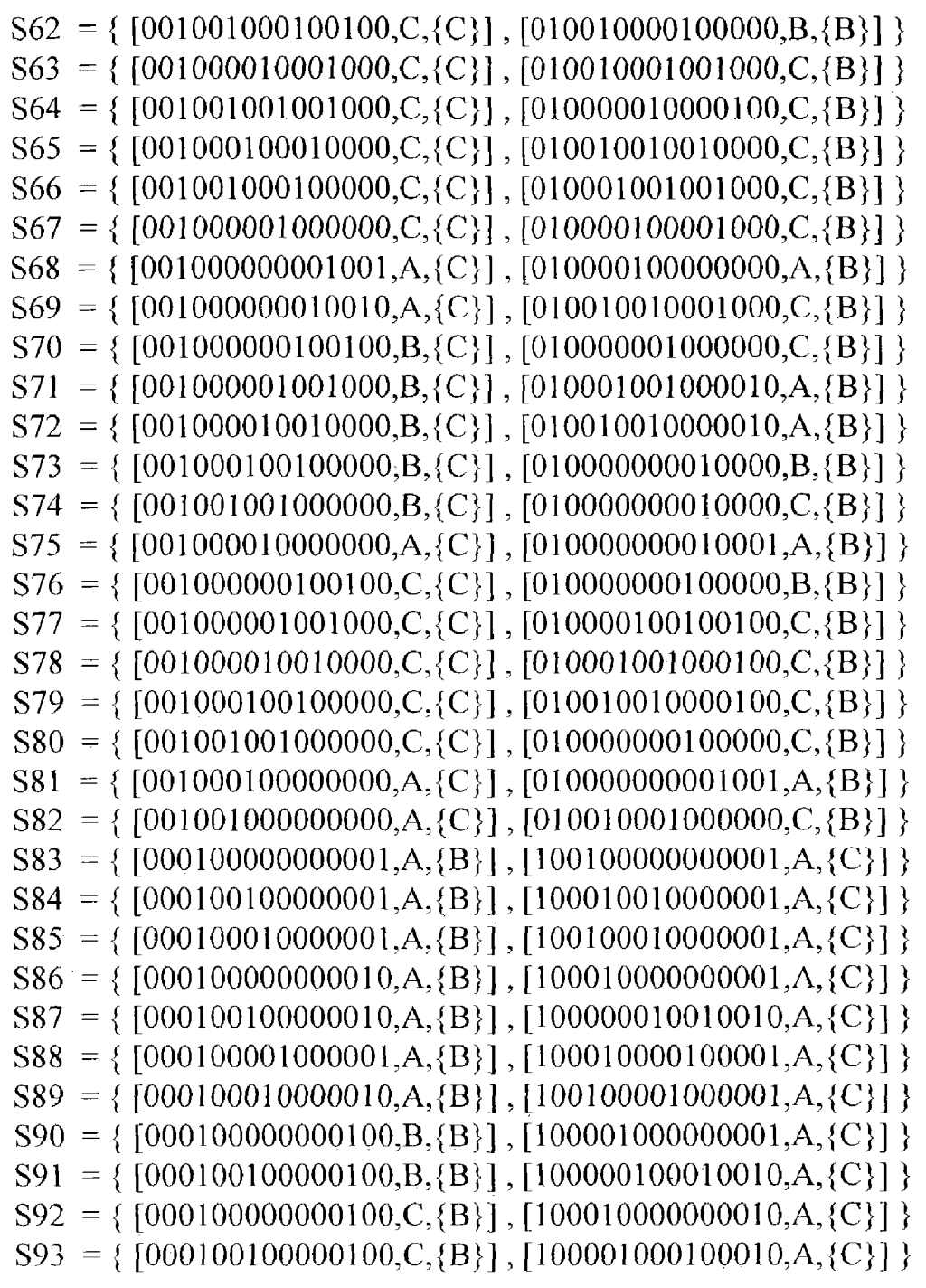
Figure 3D:
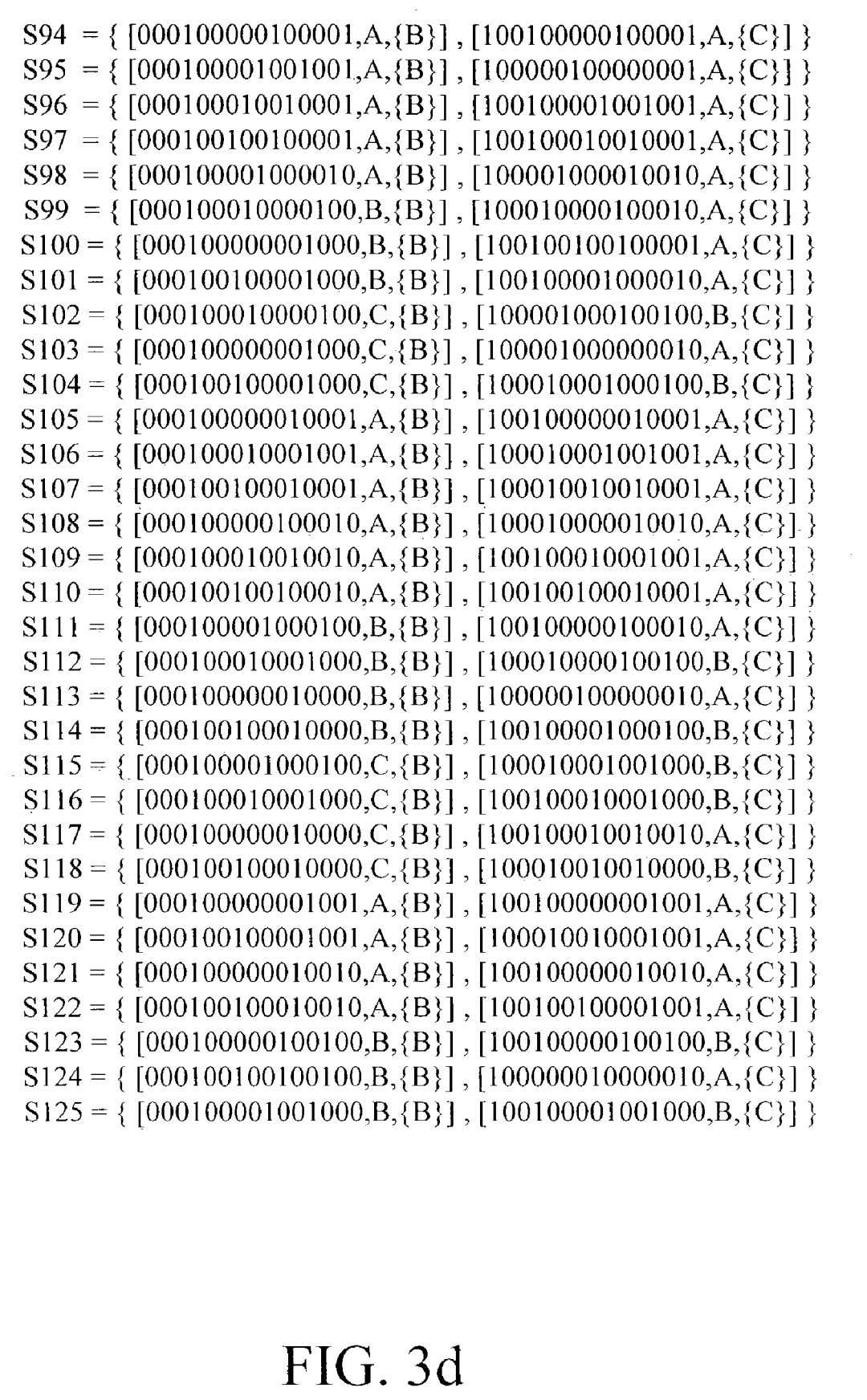
Figure 3E:
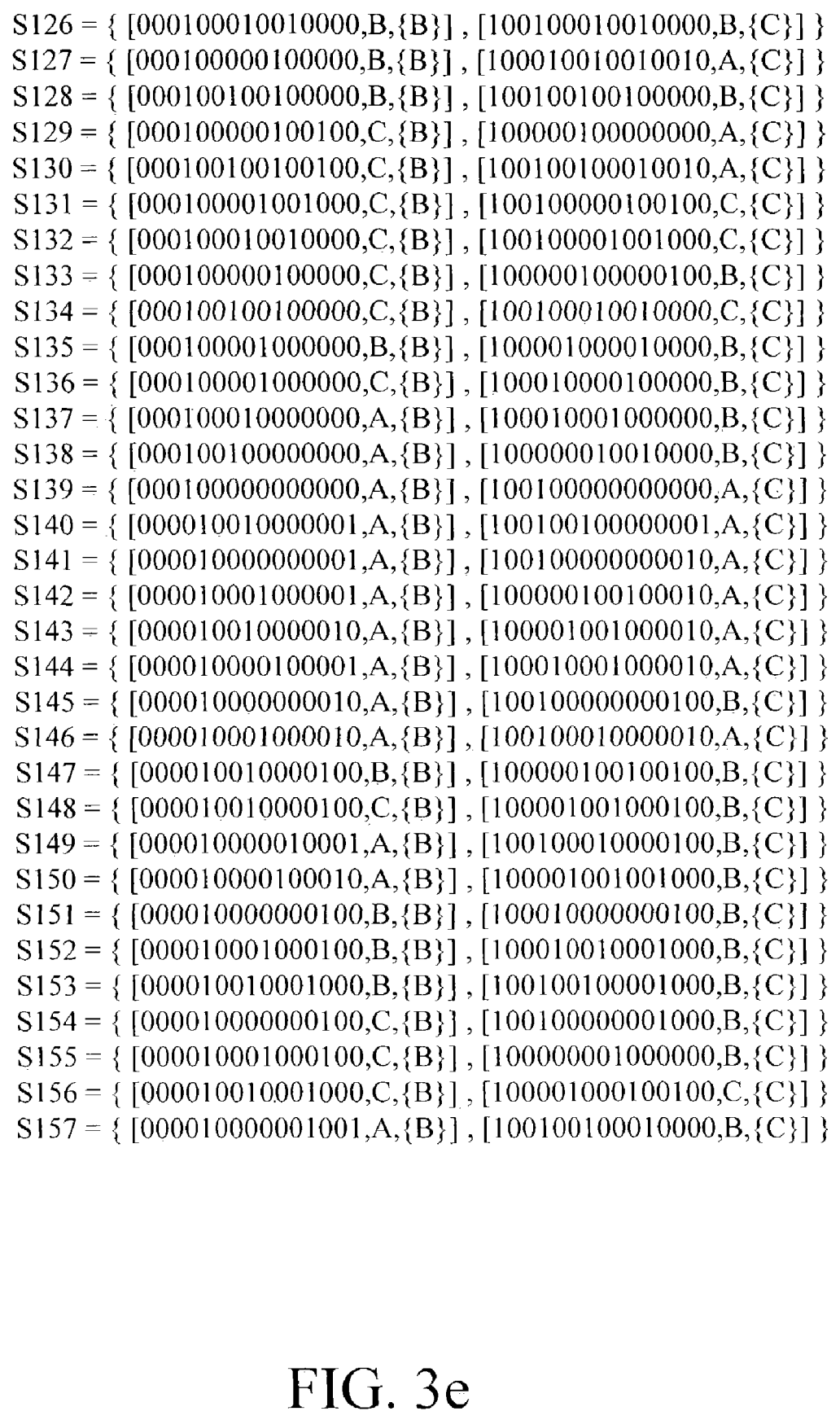
Figure 3F:
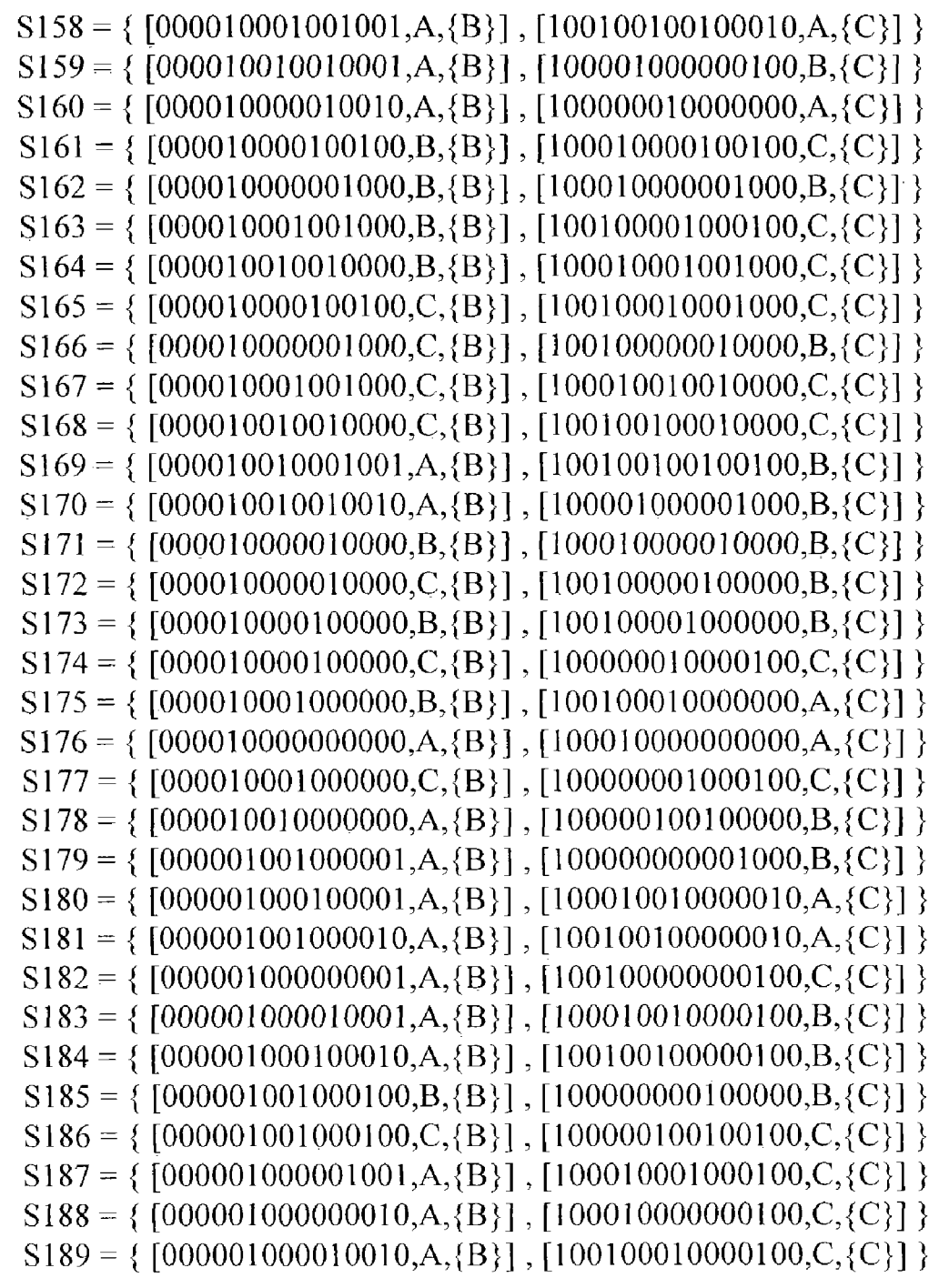
Figure 3G:
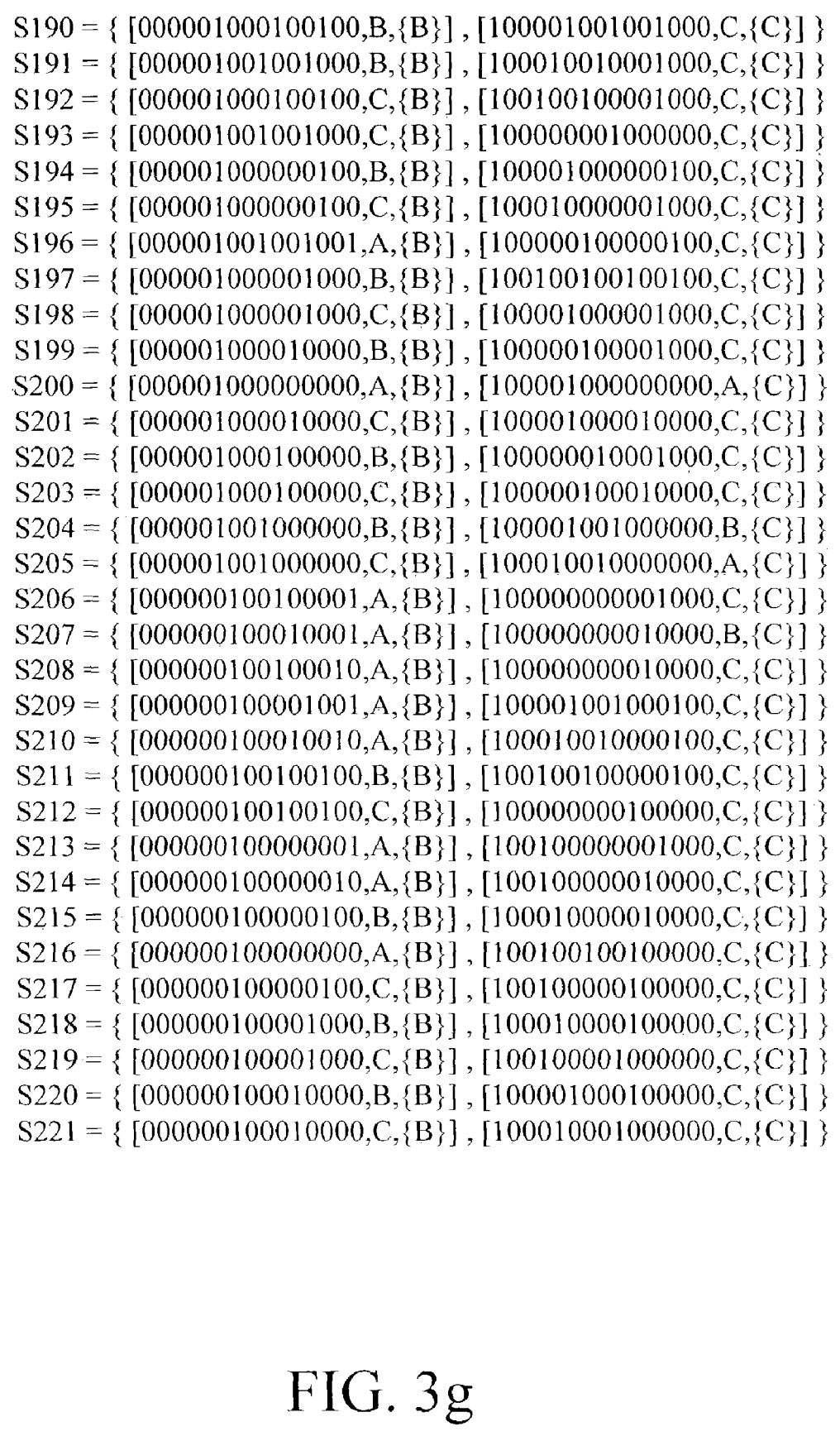
Figure 3H:
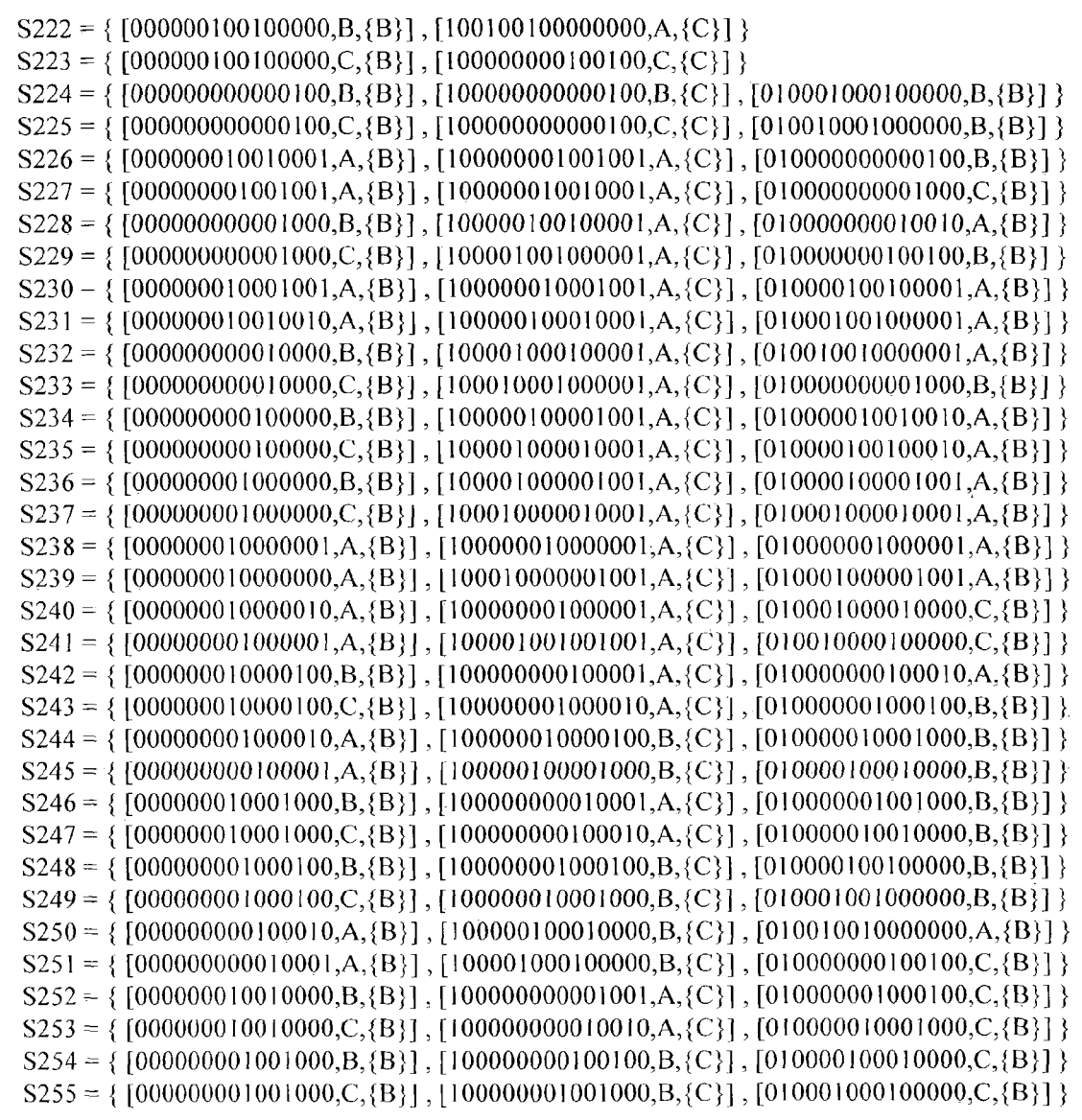

FIG. 3a to FIG. 3h are the schematic diagrams of the digital table of the encoding and decoding method of the record medium of the invention;

DETAILED DESCRIPTION OF THE INVENTION

The invention involves adopting the concept of Type and Set to develop a digital table for encoding and decoding procedures. Please refer to FIG. 3a to FIG. 3h. The disclosed method satisfies the (d, k) constraint in the encoding mechanism. The disclosed method also has a better coding rate and better DC-Free control ability with the assistance of the auxiliary conditions of type dependent and digital sum value (DSV). Furthermore, the method increases the available storage space of a record medium. With regard to the decoding procedures, the auxiliary conditions: type dependent and digital sum value, are also employed to reduce the possibility of errors in the decoding procedures.

The coding rate of the disclosed method achieves up to 8/15 by using the auxiliary conditions of set and type. The accuracy and efficiency of the decoding procedures are substantially improved. The complexity is less than that of prior technology.

Figure 1A:
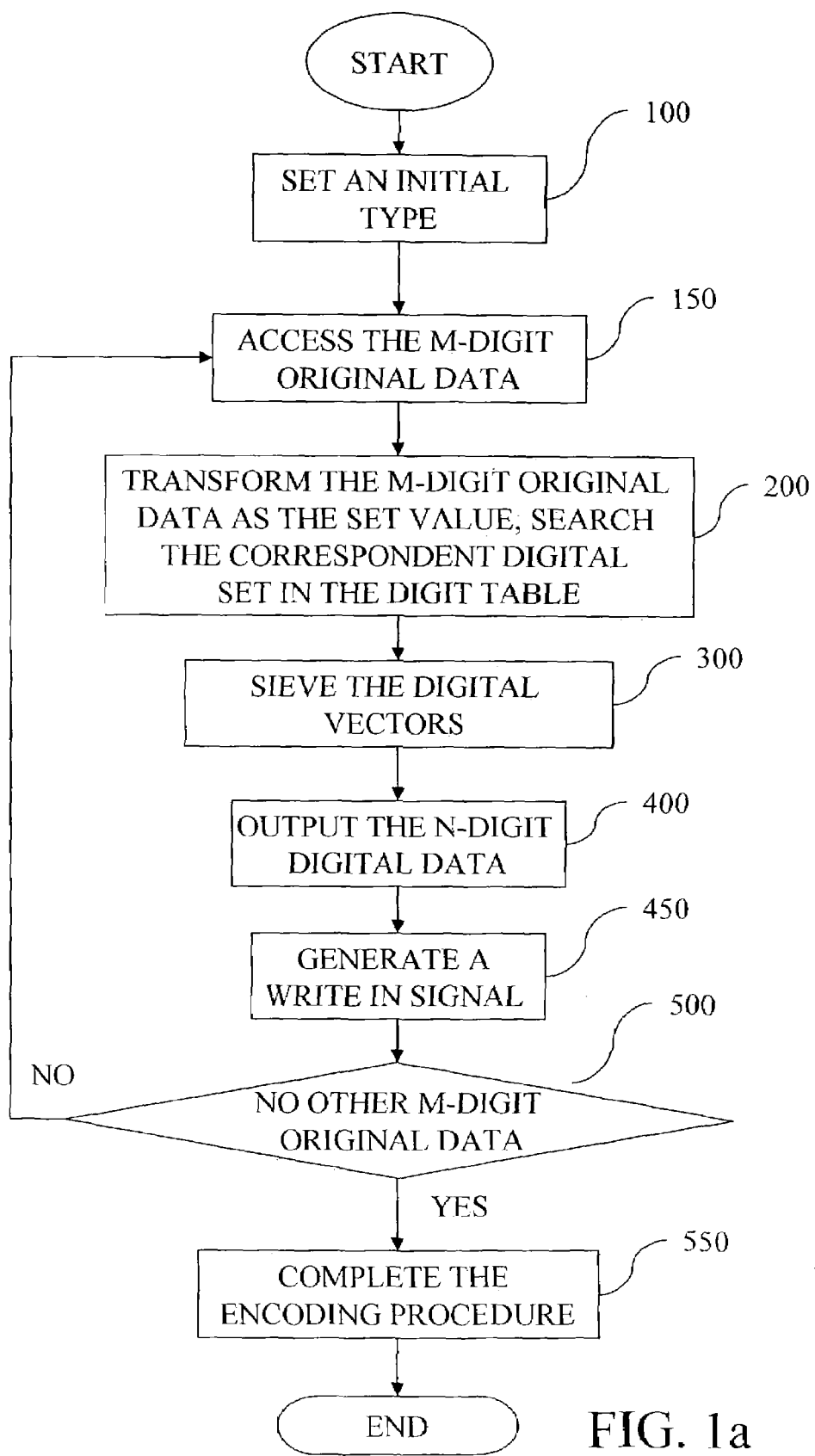
FIG. 1a and FIG. 1b are the flow charts of the encoding procedure of the encoding and decoding method of the record medium of the invention.
Figure 1B:
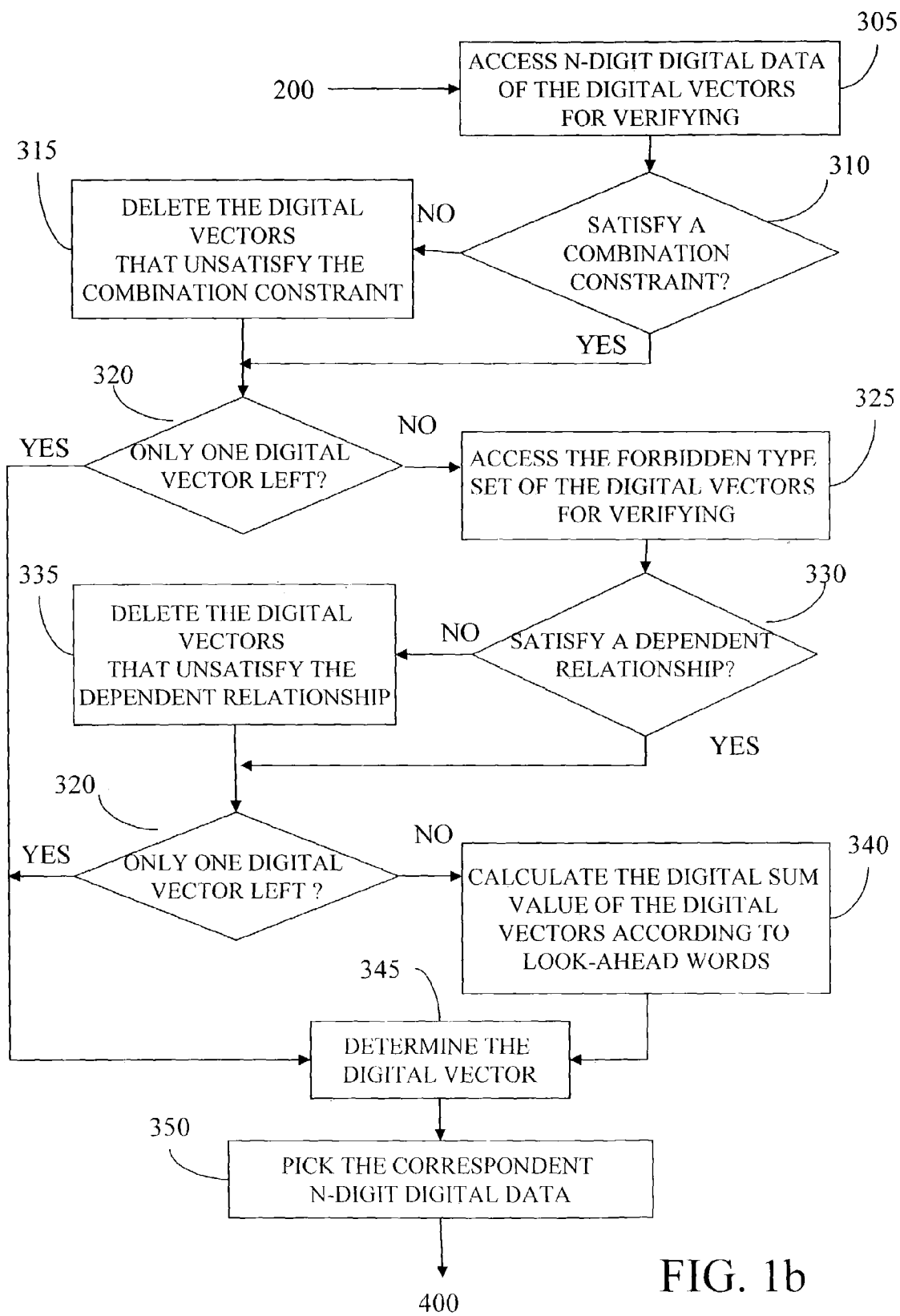

The encoding method is illustrated as follows through FIG. 1a to FIG. 1b. The method is adopted for transforming a sequence of original data, each of which is m digits, as a sequence of digital data, each of which is n digits. The sequence of digital data is recorded on a storage medium. The encoding procedure involves setting an initial type and then accessing each digital data. Each of the digital data is transformed to obtain a corresponding set value (i). Then it follows to search the digital table to obtain the corresponding digital set (Si). A unique digital vector (Vj) in the digital set is obtained via a specific sieve procedure. At last, the digital data of the digital, vector is picked as the final encoding results. The final digital data is output to store in the record medium.

The initial type is first set (step 100). The transforming procedure of the data is illustrated as the following steps. The steps involve accessing the original data (step 150), transforming the original data as a set value, searching the corresponding digital set in the digital table (step 200), sieving the digital vectors (step 300), and outputting the digital data (step 400). The set value can employ the decimal system of the original data to correspond with the digital set, i.e., 0 corresponds with S0, 1 corresponds with S1, 2 corresponds with S2 and so forth. Other systems are also used. For example, 0 corresponds with S255, 1 corresponds with S254, 2 corresponds with S253, and so forth. The sieve procedure is achieved through the combination constraint, dependent relationship and digital sum value. The detailed step is illustrated by FIG. 1b.

Step 450 generates a write in signal (step 450) to write the digital data on the record medium. When there are original data to be accessed (step 500), step 150 to step 450 continues. When it fails to access the original data (step 500), the entire encoding procedure is completed (step 550).

Figure 4:
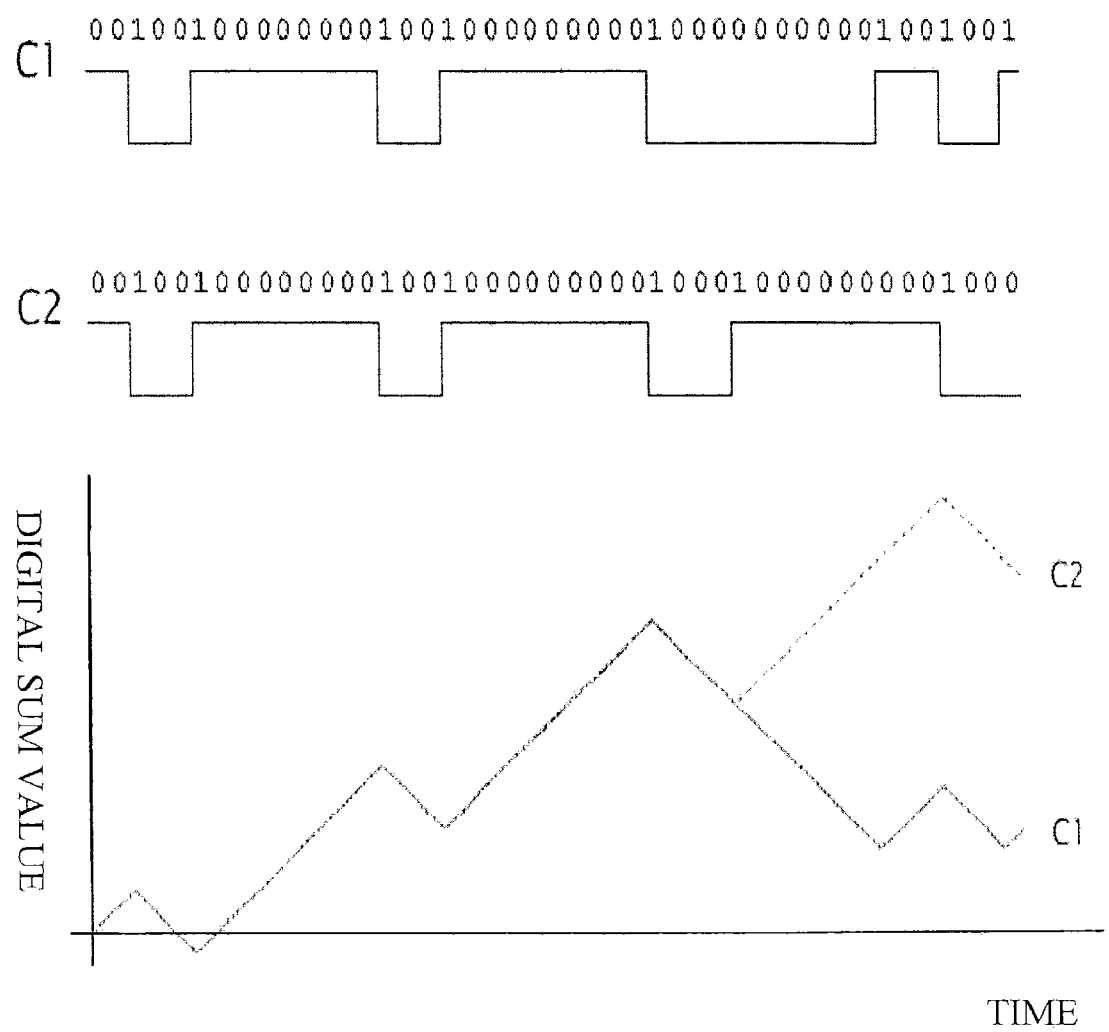
FIG. 4 is the schematic diagram of the variation of the digital sum value (DSV) of the encoding and decoding method of the record medium of the invention.

Because there is at least one digital vector in the corresponding digital set of step 200, the sieve procedure necessitates the combination constraint, dependent relationship and digital sum value. The sieve procedure refers to FIG. 1b. The order of the sieve conditions is not limited. Step 350 involves accessing each of the digital vectors one by one for verifying, i.e., for judging whether each of the digital vectors conforms to combination constraint. The combination constraint is a numeral combination constraint, or (d, k) constraint. The (d, k) constraint indicates that the number of '0' between any two '1' must lie in between d and k. The d is an integral not less than '0'. The k is an integral not less than 'd'. If not satisfying the combination constraint, the unsatisfying digital vectors are deleted (step 315). Then the encoding procedure checks if there is only one digital vector rest (step 320). If not, the encoding procedure accesses forbidden type set of each of the digital vectors for verifying (step 325) whether satisfying the dependent relationship (step 330)? If the forbidden type set of each of the digital vectors does not satisfy the dependent relationship, the unsatisfying digital vectors are then deleted (step 335). The dependent relationship indicates that the conjunction of the type of the previous digital vector and the forbidden type set of the following digital vector is empty, i.e., the type of the previous digital vector can not appear in the forbidden type set of the following digital vector. The independent relationship assures that the previous digital vector connects with the consequent digital vector. Then it judges if there is only one digital vector rest (step 320). If not, it calculates the digital sum value of each digital vector according to look-ahead words(step 340). The look-ahead words indicates the needed number of successive digital vectors when calculating the digital sum value. Finally, the digital vectors are determined according to the least absolute value of the sum value (step 345). Please refer to FIG. 4. The n-digit digital data, corresponding with the digital vector, are picked (step 350). Then the flow goes back to step 400 to continue the following steps. In the above-mentioned steps, when there is only one digital vector left in any sieve procedure, the final digital data are determined. Therefore, the flows do not perform the following sieve procedures and go to the step 345.

Figure 2:
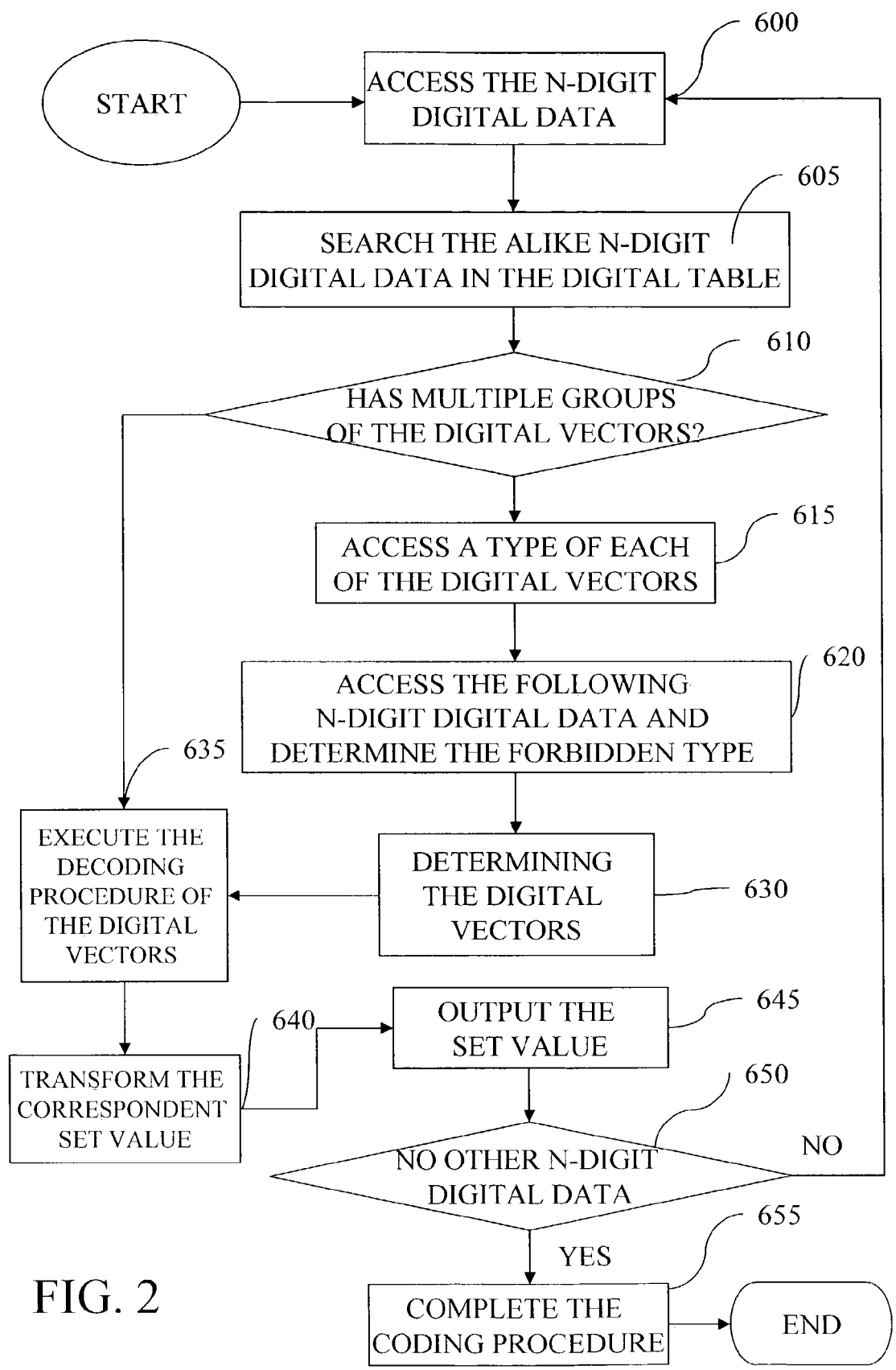
FIG. 2 is the flow chart of the decoding procedure of the encoding and decoding method of the record medium of the invention.

The disclosed decoding method is then illustrated in detail with reference of FIG. 2. The decoding method of the invention is for transforming a sequence of n-digit digital data, as a sequence of m-digit original data. The decoding procedures search the digital vector (Vj) corresponding to the digital vector in the digital table. The unique digital vector and the digital set (Si) corresponding to the digital-vector are then found after the sieve procedure. At last, the corresponding set value, (i) having the final decoding result, is output.

The transforming procedure of the digital data is described in detail as follows. The flows involve accessing the digital data (step 600), then searching the alike digital data in the digital table (step 605) for finding the satisfying digital vector. If there are satisfying digital vectors, the flows continue the following steps.

Step 615 involves accessing the type of each digital vector, then reading the next digital data and determining the forbidden type set value (step 620). Finally, determines the digital vector in step 630, i.e., selects the conjunction of the type and the forbidden type set which is empty as the final digital vector. The final digital vector in step 630 connects to the next digital data.

The decoding procedure of the digital vector is executed (step 635) either when the final digital vector is determined or when there is only one satisfying digital vector. Step 640 transforms the corresponding set value. Step 645 finally outputs the set value. When there is still a digital vector available (step 650), the decoding procedure continues step 600 to step 645. The decoding procedures are completed (step 655) until accessing the digital data fails (step 650).

The above-mentioned m, n, j, and i are integrals. The digital table must satisfy the condition of 2m digital sets. Each digital set has at least one digital vector. The conjunction of any two digital vectors-must be an empty set. Each digital vector either has digital data, type and forbidden type set, or digital data and-type. When the digital data in the digital vector are the same, the type of which is consequently different, and the forbidden type set is the same. The type is determined by the number of the ending '0' after the last '1'. When the number of the last '0' is 0, 1, 7, 8, 9, 10, or 11, the type is categorized to type A. When the number of the last '0' is 2, 3, 4, 5, 9, or 6, the type is categorized to type B and type. The forbidden type set is a set having at least one element of the type. The forbidden type set is determined by the number of leading '0' before a first '1'. When the number of the leading '0' is 0 ,3, or 5, the type is defined as {B}. When the number of the leading '0' is 1, 2, 4 or 6, the type is defined as {C}. Or when the number of the leading '0' is 0 and 5, the type is defined as {B}, and the number of the leading '0' is 1, 3, 4, 5, or 6, the type is defined as {C}

Generally, the digital set (Si) is expressed as:

$Si=\{[\text{digital vector } (Vj)], [\text{digital vector } (Vj+1)], \ldots\}$.

The digital vector is expressed as:

$Vj=[\text{digital data of n digits, type, forbidden type set}]$ or $Vj=[\text{digital data of n digits, type}]$ The type has at least one element.

The preferred embodiment of the method is illustrated as follows. In the preferred embodiment, given m=8, n=15, (d, k)=(2,12), initial type as A, The digital tables are shown as FIG. 3a to FIG. 3h.

Figure 5:
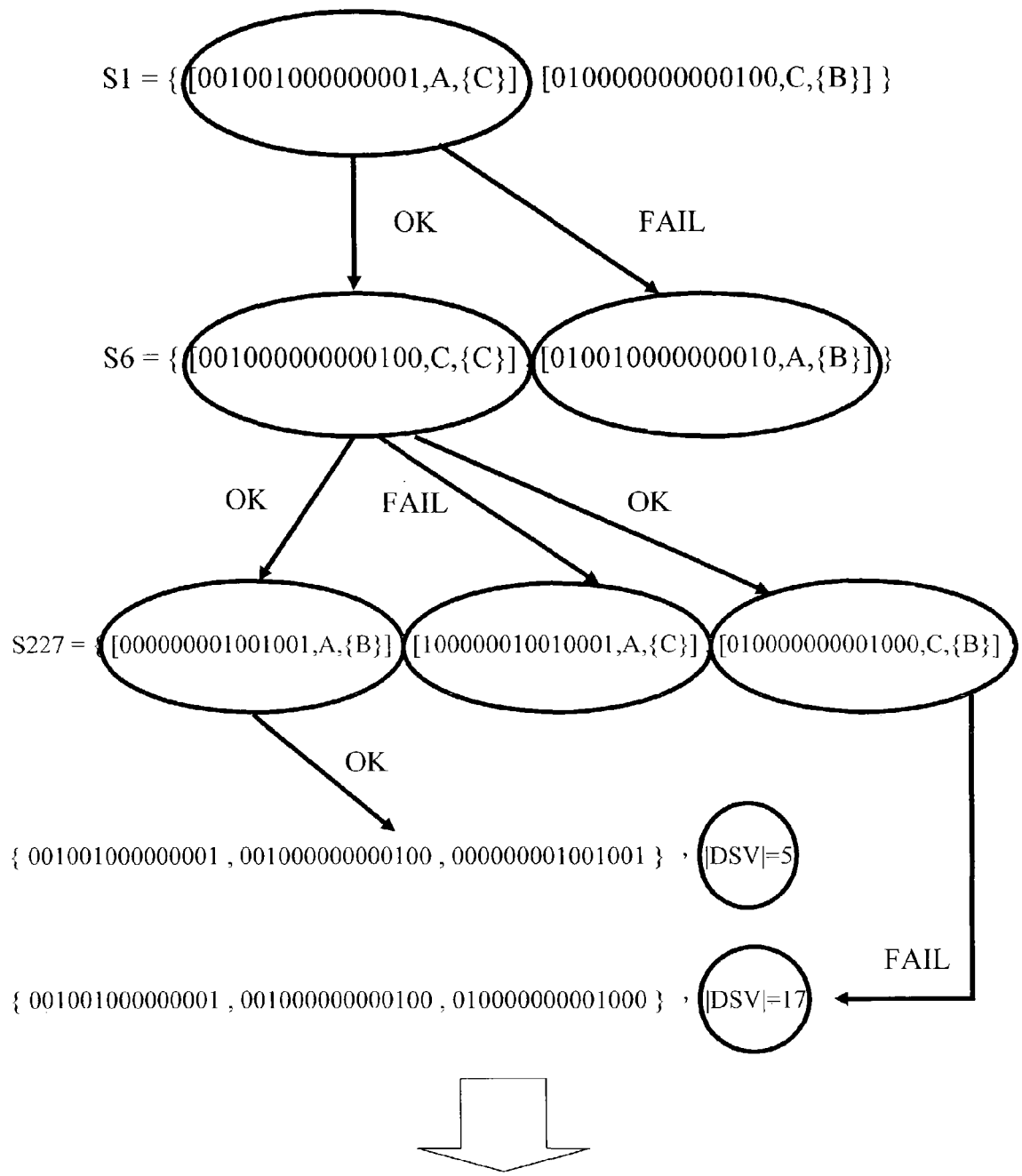
FIG. 5 is the scheimatic diagram of the encoding procedure of an embodiment of the digital table of the encoding and decoding method of the record medium of the invention.

Please refer to FIG. 5. Suppose that the original data is 1, 6, and 227 respectively. After accessing '1', the correspondent digital set S1 is found in the digital table. The digital data of the first digital vector in S1 is the final digital data because the initial type is $A_i$: i.e., "001001000000000" in [001001000000000, A, {C}]. Then the flows involve accessing '6' and searching the digital set of S6. Because the digital data in the second digital vector do not satisfy the combination constraint, the first digital vector is selected as the final digital data, i.e., "001000000000100" in [001000000000100, C, {C}]. When accessing '227' finally, it is abandoned because the second digital vector does not satisfy the dependent relationship. Because: the absolute value of the digital sum value of the first digital vector (C1=5 in FIG. 4) is less than that of the third digital vector (C2=17 in FIG. 4), the digital data in the first digital vector are selected as the final digital data, i.e., "010000000001000" in [010000000001000,C, {B}]. Consequently, the final sequence is {001001000000000, 001000000000100, 010000000001000}.

Figure 6:
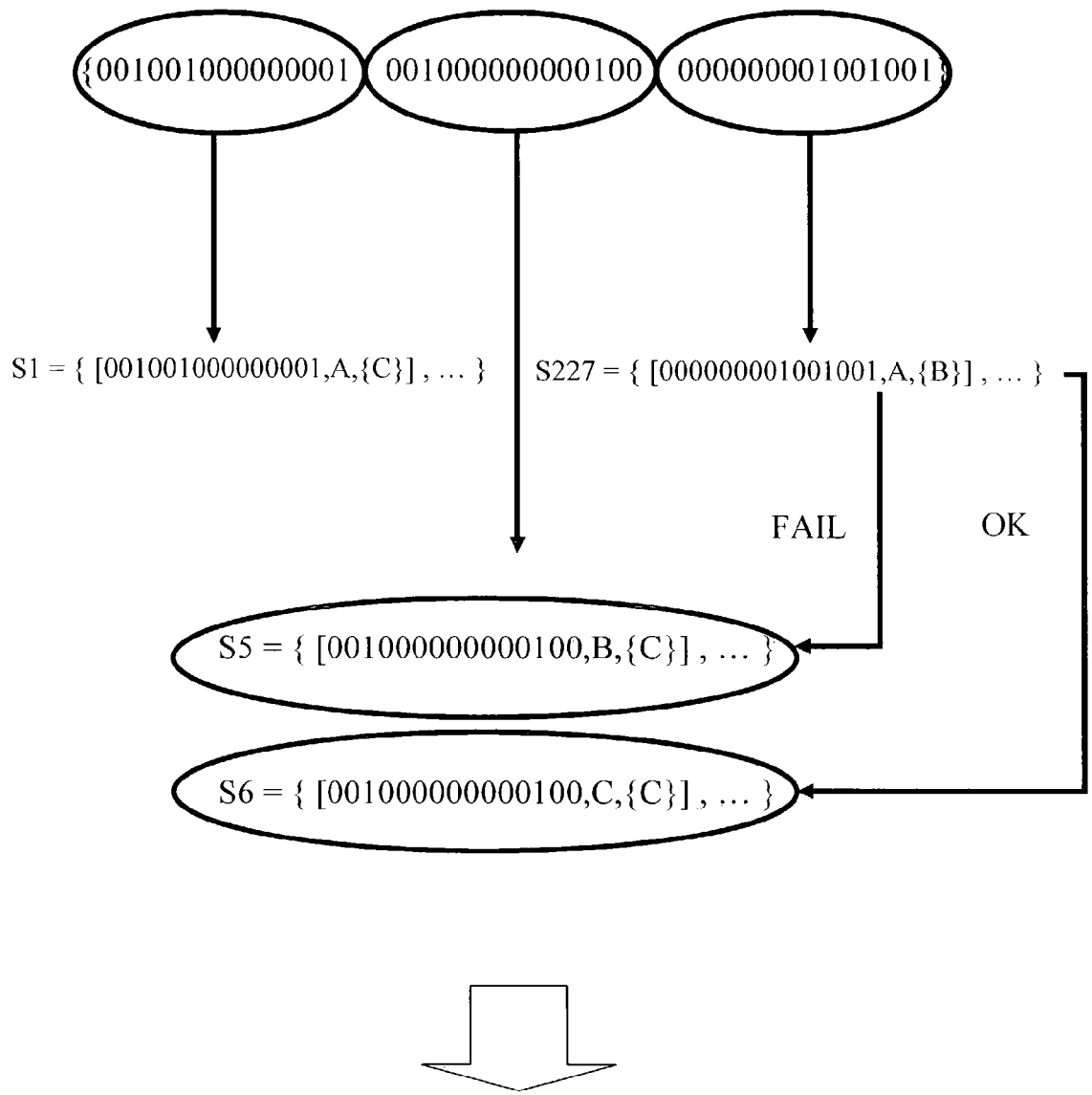
FIG. 6 is a schematic diagram of the decoding procedure of an embodiment of the digital table of the encoding and decoding method of the record medium of the invention.

Suppose that the input data are the digital data {001001000000000, 001000000000100, 010000000001000} that have been encoded, the decoding procedure is illustrated with the reference of FIG. 6. It can be assured that the first digital data only exist in the digital vector of the digital set S1 through searching the digital tables. Therefore, the first digital data are selected as '1'. The second digital data are found existing in the first digital vector of the digital set S5 and in the first digital vector of the digital set S6 respectively through searching the digital table. The second digital data are[001000000000100,B, {C}] and [001000000000100,C, {C}] respectively. Because the third digital data are found only in the first digital vector of the digital set S227, the third original data are selected as '227'. Since the forbidden type set of the digital vector is {B}, the second original data are deduced as '6'. The final sequence of the original data is '1', '6', and '227' which is the same as the input data before encoding.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A encoding method of record medium, for modulating a sequence of original data of m digits as a sequence of digital data of n digits, the encoding procedures of the method involving accessing the original data of the m digits after setting an initial type, obtaining a corresponding set value (i) after the original data of the m digits is transformed, and searching a corresponding digital set (Si) in a digital table, then obtaining a unique digital vector (Vj) in the digital set via a sieve procedure, picking the digital data of the n digits of the digital vector, finally outputting the encoding results, the digital data of the n digits be output to the record medium to store after repeating the encoding procedures, said method comprising the steps of:
   accessing the original data of the m digits;
   transforming the original data of the m digits into the set value, and searching the corresponding digital set in the digital table;
   processing the sieve of the digital vector;
   outputting the digital data of the n digits; and
   generating a write-in signal;
   wherein when satisfying the conditions of the step of accessing the original data of the m digits, the method continuing the encoding procedures; when unsatisfying the conditions of the step of accessing the original data of the m digits, the method terminating the encoding procedures.

2. The encoding method according to claim 1, wherein the values of the m, n, i, and j are integrals.

3. The encoding method according to claim 1, wherein m equals 8, and n equals 15.

4. The encoding method according to claim 1, wherein the digital table satisfies the conditions of including 2 m digital set (Si).

5. The encoding method according to claim 4, wherein conjunction of any two sets of the digital set (Si) is an empty set.

6. The encoding method according to claim 1, wherein the digital set (Si) at least comprises a digital vector (Vj) and the digital set (Si) is expressed as:

$Si$={[digital vector ($Vj$)], [digital vector ($Vj$+1)], ... }.

7. The encoding method according to claim 1, wherein the digital vector (Vj) comprises the digital data of the n digits, a type, and a forbidden type set and is expressed as:

$Vj$=[digital data of n digits, type, forbidden type set].

8. The encoding method according to claim 7, wherein when the digital data of the n digits of the digital vector (Vj) is the same, the type of which is different.

9. The encoding method according to claim 7 wherein when the digital data of the n digits of the digital vector (Vj) is the same, the forbidden type set of which is the same.

10. The encoding method according to claim 1, wherein the digital vector (Vj) comprises the digital data of the n digits and the type, and is expressed as:

$Vj$=[digital data of n digits, type].

11. The encoding method according to claim 7, wherein the forbidden type is determined by the number of an ending '0' after a last '1' in the digital data of n digits.

12. The encoding method according to claim 11, wherein when the number of the last '0' is 0, 1, 7, 8, 9, 10, or 11, the type is categorized to type A, when the number of the last '0' is 2, 3, 4, 5, or 6, the type is categorized to type B and type C.

13. The encoding method according to claim 7, wherein the forbidden type set is a set having at least one element of the type.

14. The encoding method according to claim 7, wherein the definition of the forbidden type set is determined by the number of a leading '0' before a first '1' in the digital data of n digits.

15. The encoding method according to claim 14, wherein when the number of the leasing '0' is 0, 3, or 5, the type is defined as {B}, when the number of the leading '0' is 1, 2, 4 or 6, the type is defined as {C}.

16. The encoding method according to claim 14, wherein when the number of the leasing '0' is 0 or 2, the type is defined as {B}, when the number of the leading '0' is 1, 3, 4, 5, or 6, the type is defined as {C}.

17. The encoding method according to claim 1, wherein the step of processing the sieve of the digital vector further comprises steps of:
   accessing the digital data of the n digits of the digital vector on by on for verifying;
   reversing the digital vector satisfying a combination constraint;
   accessing the forbidden type set of the digital vector on by on for verifying;
   reversing the digital vector which satisfies a dependent relationship;
   calculating the digital vector's digital sum value according to look-ahead words;
   determining the digital vector; and
   picking the corresponding digital data of the n digits.

18. The encoding method according to claim 17, wherein the combination constraint is DK-Constraint, i.e., (d, k) constraint, which indicates the number of '0' between any two '1' is between d that is an integral not smaller than 0 and k that is an integral not smaller than d.

19. The encoding method according to claim 18, wherein d equals 2, and k equals 12.

20. The encoding method according to claim 17, wherein the dependent relationship indicates that the conjunction of the type of the former digital vector (Vj−1) and the forbidden type set of the digital vector (Vj) is an empty set.

21. The encoding method according to claim 17, wherein the look-ahead words indicates the needing number of picking the digital vector when calculating the digital sum value (DSV).

22. The encoding method according to claim 17, wherein the step of determining the digital vector indicates selecting the minimum among the absolute values of the digital sum value.

23. The encoding method according to claim 1, wherein the step of generating a write-in signal is by way of Non-Return to Zero Inverted (NRZI) modulation.

24. A decoding method of record medium, for modulating a sequence of digital data of n digits as a sequence of original data of m digits, the decoding procedures of the method involving searching a corresponding digital vector of the digital data of the n digits in the digital table, obtaining a unique digital vector after a comparing procedure, determining a corresponding digital set (Si) of the digital vector, outputting the corresponding set value (i) as the decoding result, for obtaining sequence of original data of m digits after repeating decoding procedures, said method comprising the steps of:
    accessing the digital data of the n digits;
    searching same digital data of the n digits in the digital table;
    when there being multiple same digital vector, further comprising the steps of:
    accessing a type of the digital vector;
    accessing next n-digit digital data and determining the forbidden type set value; and
    determining the digital vector;
    executing the decoding procedure of the digital vector;
    transforming a correspondent set value; and
    outputting the set value;
    wherein when satisfying the conditions of the step of accessing the digital data of the n digits, the method continuing the decoding procedures; when unsatisfying the conditions of the step of accessing the digital data of the n digits, the method terminating the decoding procedures.

25. The decoding method according to claim 24, wherein the values of the m, n, i, and j are integrals.

26. The decoding method according to claim 24, wherein m equals 8, and n equals 15.

27. The decoding method according to claim 24, wherein the digital table satisfies the conditions of including 2 m digital set (Si).

28. The decoding method according to claim 27 wherein conjunction of any two sets of the digital set (Si) is an empty set.

29. The decoding method according to claim 24, wherein the digital set (Si) at least comprises a digital vector (Vj) and the digital set (Si) is expressed as:

$Si=\{[\text{digital vector } (Vj)], [\text{digital vector } (Vj+1)], \ldots \}$.

30. The decoding method according to claim 24, wherein the digital vector (Vj) comprises the digital data of the n digits, a type, and a forbidden type set and is expressed as:

$Vj=[\text{digital data of n digits, type, forbidden type set}]$.

31. The decoding method according to claim 30, wherein when the digital data of the n digits of the digital vector (Vj) is the same, the type of which is different.

32. The decoding method according to claim 30, wherein when the digital data of the n digits of the digital vector (Vj) is the same, the forbidden type set of which is the same.

33. The decoding method according to claim 24, wherein the digital vector (Vj) comprises the digital data of the n digits and the type, and is expressed as:

$Vj=[\text{digital data of n digits, type}]$.

34. The decoding method according to claim 30, wherein the forbidden type is determined by the number of an ending '0' after a last '1' in the digital data of n digits.

35. The decoding method according to claim 34, wherein when the number of the last '0' is 0, 1, 7, 8, 9, 10, or 11, the type is categorized to type A, when the number of the last '0' is 2, 3, 4, 5, or 6, the type is categorized to type B and type C.

36. The decoding method according to claim 30, wherein the forbidden type set is a set having at least one element of the type.

37. The decoding method according to claim 36, wherein the definition of the forbidden type set is determined by the number of a leading '0' before a first '1' in the digital data of n digits.

38. The decoding method according to claim 36, wherein when the number of the leasing '0' is 0, 3, or 5, the type is defined as {B}, when the number of the leading '0' is 1, 2, 4 or 6, the type is defined as {C}.

39. The decoding method according to claim 36, wherein when the number of the leasing '0' is 0 or 2, the type is defined as {B}, when the number of the leading '0' is 1, 3, 4, 5, or 6, the type is defined as {C}.

40. The decoding method according to claim 24, wherein the step of determining the digital vector indicates that selecting an empty set which is the conjunction of the type and the forbidden type set.

* * * * *